United States Patent

Saunders et al.

Patent Number: 5,531,876
Date of Patent: Jul. 2, 1996

[54] SPUTTER CATHODE

[75] Inventors: Mark Saunders, Rodenbach; Berthold Ocker, Hanau, both of Germany

[73] Assignee: Leybold Aktiengesellschaft, Hanau, Germany

[21] Appl. No.: 392,709

[22] Filed: Feb. 23, 1995

[30] Foreign Application Priority Data

Apr. 26, 1994 [DE] Germany .......................... 44 14 470.9

[51] Int. Cl.⁶ .................................................. C23C 14/34
[52] U.S. Cl. ................... 204/298.12; 204/298.13
[58] Field of Search ....................... 204/298.12, 298.13, 204/192.12

[56] References Cited

U.S. PATENT DOCUMENTS

| | | | |
|---|---|---|---|
| 4,444,643 | 4/1984 | Garnett | 204/298.12 |
| 4,885,075 | 12/1989 | Hillman | 204/298.12 |
| 5,203,980 | 4/1993 | Cremer et al. | 204/298.12 |
| 5,269,403 | 12/1993 | Pouliquen | 204/298.12 |
| 5,372,694 | 12/1994 | Szczyrbowski | 204/298.12 |

FOREIGN PATENT DOCUMENTS 2-285069  11/1990  Japan .................................. 204/298.12

Primary Examiner—R. Bruce Breneman
Assistant Examiner—Rodney G. McDonald
Attorney, Agent, or Firm—Felfe & Lynch

[57] ABSTRACT

The target (5) of a sputter cathode 3 is permanently bonded to a metallic backing plate (14, 15) with a coefficient of thermal expansion similar to that of the target (5). This backing plate (14, 15) is held removably on the electrode (4), for example by means of spring clips (16, 17).

3 Claims, 2 Drawing Sheets

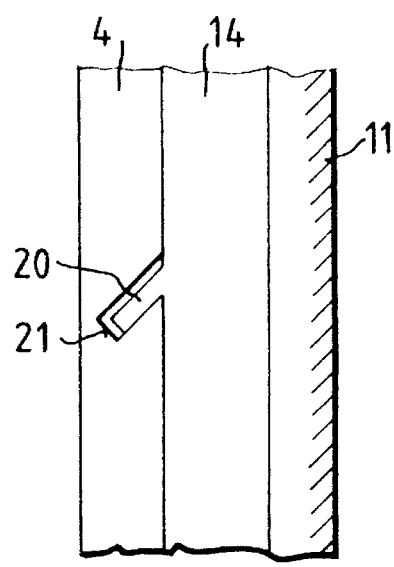
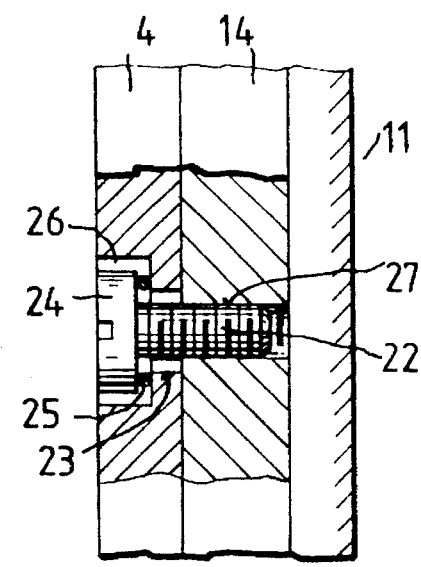

SPUTTER CATHODE

BACKGROUND OF THE INVENTION

The invention pertains to a sputter cathode with an electrode to which at least one target to be sputtered is attached.

Sputter cathodes of the type indicated above are used in coating systems for sputtering and are generally known. Its target is usually bonded permanently to the electrode. This leads to problems, however, when the coefficient of expansion of the target material differs significantly from that of the electrode and when the electrode and the target have large surface areas. Widely differing coefficients of expansion occur, for example, when the target consists of indium-tin oxide and thus the metal electrode must be bonded to a nonmetal. Large-area electrodes and targets are required when it is desired to coat substrates with large surface areas in a static manner, that is, without the movement of the substrate.

To prevent the target from cracking as a result of a difference in the coefficients of expansion, sputter cathodes are known in which, instead of a single target with a large surface area, several targets are bonded to the electrode like tiles, one next to the other. The disadvantage here, however, is that the solder used for bonding also intrudes between the targets and is atomized during sputtering, with the result that the layer sputtered onto the substrate is contaminated.

SUMMARY OF THE INVENTION

The invention provides a sputter cathode of the type described above which minimizes the danger that the target will crack. This is accomplished by permanently bonding the target to a metallic backing plate with a coefficient of thermal expansion similar to that of the target, and by removably connecting this backing plate to the electrode.

By means of a backing plate connected permanently to the target, with a coefficient of expansion similar to that of the target, the thermal stresses in the target which could lead to cracking are avoided. Because only the backing plate must be coordinated with respect to the coefficient of expansion to the target, the electrode can consist of some other material, selected for optimum performance. When the sputter cathode according to the invention is used, it is easier to replace an atomized target with a new target, because, for this purpose, it is enough merely to remove the target with its backing plate and not the entire electrode itself. As a result, the parts to be removed can be much lighter than in the case of known sputter cathodes. This feature is especially important in the case of sputter cathodes with large surface areas.

It is especially easy to replace a target in the case of large surface area sputter cathodes when the target consists of several target segments, which are arranged like tiles on the electrode, each of them being provided with its own backing plate. A design such as this means that, in the event that only certain areas of the target become damaged, it is possible to replace only the individual target segments involved. This replacement can be accomplished without special equipment, because the weight of the individual target segments with their associated backing plate is much less than that of a complete electrode with target. In operations where coating processes are carried out with different materials, furthermore, it is no longer necessary to keep on hand an inventory of complete cathode troughs, i.e., electrodes with targets; on the contrary, it is necessary only to stock the backing plates carrying the targets of different materials. Transport costs are also lower, because the targets must be shipped only with their backing plates and not together with the electrodes.

If, for the attachment of the backing plate or plates, spring clips, which are able to grip around projections on the backing plate or plates, are provided on the side of the electrode facing the backing plates, the target or a segments of a target can be replaced without tools.

It is even more convenient to remove and reinstall a target or a segment of a target provided with a backing plate when, according to another embodiment of the invention, each backing plate is provided on its rear surface with at least one downward pointing, slanted hanger lug, which is designed to hang in a corresponding, upward-slanting slot in the front surface of the electrode.

The backing plate is pressed with very great force against the electrode when at least one screw is provided for the attachment of each individual backing plate. This screw passes through a bore in the electrode with radial clearance and rests with its head against an elastic seal in a widened area of the bore in the electrode. These high contact forces ensure an especially good transfer of heat, so that the target is efficiently cooled by the cooling of the electrode.

When a target of indium-tin oxide (ITO) is used, it is advantageous for the backing plate to consist of molybdenum. Molybdenum has a coefficient of expansion which is comparable to that of ITO and also has a high modulus of elasticity, so that even when the plates are only 3–4 mm thick, sufficient stability is provided to prevent damage to the target during handling. The heat transfer via the backing plate from the target to the electrode is not as good as that in a design without a backing plate, and this obviously leads to higher target temperatures. In the case of ITO targets, however, these higher temperatures have the effect of reducing the growth of "pimples", which is therefore advantageous with respect to the problem of arcing.

BRIEF DESCRIPTION OF THE DRAWING

FIG. 3 shows a cross section through a second embodiment of a target attachment area on a scale larger than that of FIG. 1; and FIG. 4 shows a cross section through a third embodiment of a target attachment area on a scale larger than that of FIG. 1.

DETAILED DESCRIPTION OF THE PREFERRED EMBODIMENT

Figure 1:
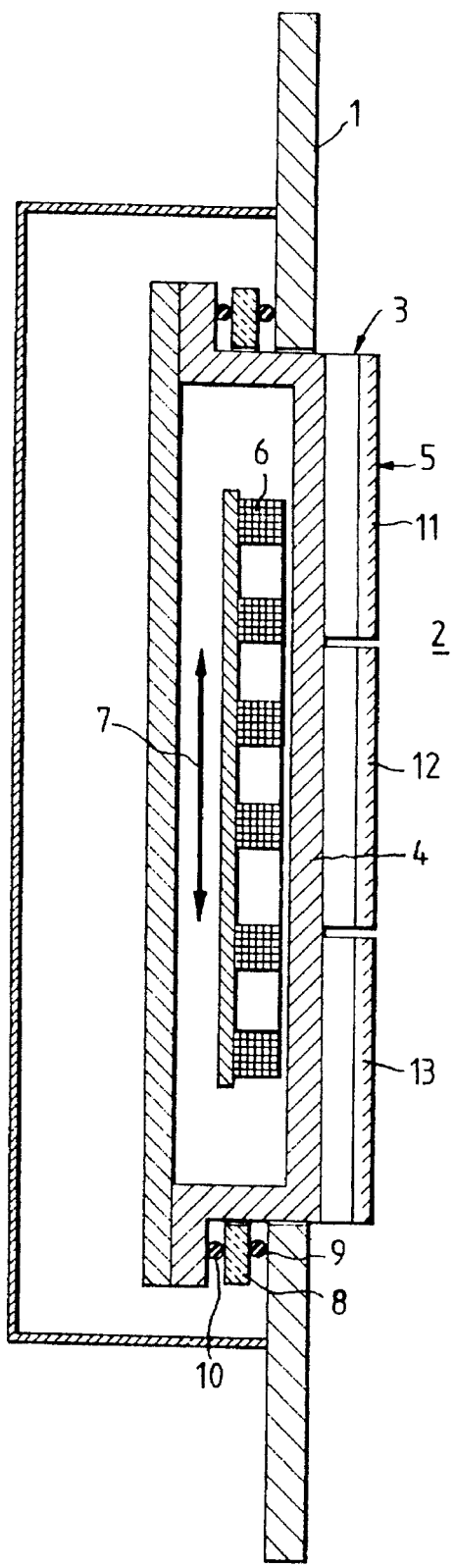
FIG. 1 shows a cross section through the wall area of a coating chamber with a sputter cathode according to the invention.

FIG. 1 shows a part of a wall 1, which separates a coating chamber 2 from the atmosphere. This wall 1 holds a sputter cathode 3, which consists essentially of a pan-shaped electrode 4, a target 5, and a set of magnets 6. Set of magnets 6 can be moved inside pan-shaped electrode 4, as indicated by a double arrow 7. This movability serves to produce a homogeneous layer on a stationary substrate (not shown), set up opposite target 5.

Sputter cathode 3 is separated electrically by an insulator 8 from wall 1, so that it can be connected to a negative potential and so that wall 1 can be connected to ground.

Seals 9, 10 prevent air from entering coating chamber 2 in the area of sputter cathode 3.

Figure 2:
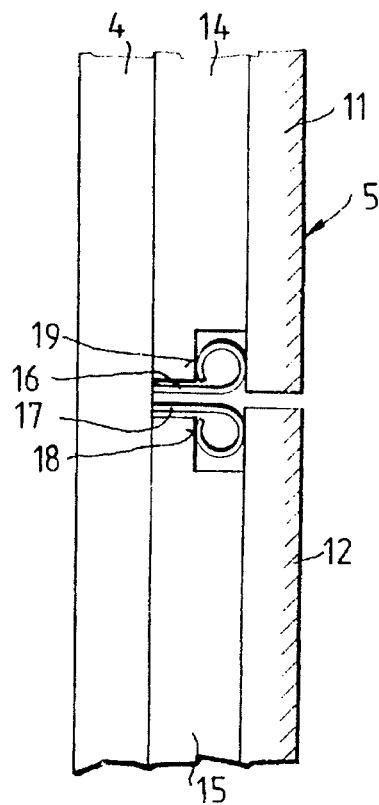
FIG. 2 shows a cross section through a target attachment area on a scale larger than that of FIG. 1.

Target 5 is divided into several target segments 11, 12, 13, which are arranged like tiles on electrode 4 and are removably attached thereto. FIGS. 2–4 show different ways in which the segments can be removably attached.

FIG. 2 shows by way of example how target segments 11 and 12 are attached to backing plates 14 and 15, respectively. This attachment is permanent and is achieved by bonding. The important point here is that the material selected for backing plates 14, 15 is such that its coefficient of expansion is as close as possible to that of the target material. If target segments 11, 12 consist, for example, of indium-tin oxide, then it would be advantageous for backing plates 14, 15 to be made of molybdenum.

Several spring clips 16, 17 of beryllium-copper are attached to electrode 4; these clips engage shoulders 18, 19 on backing plates 14, 15 and thus hold these plates with pretension against electrode 4.

In the embodiment according to FIG. 3, backing plate 14 has downward pointing hanger lugs 20 on the side facing electrode 4; these lugs are able to engage in corresponding slots 21 in the vertical front surface of electrode 4 and thus, by virtue of the weight of target 11 and backing plate 14, are able to hold the plate in contact with electrode 4.

FIG. 4 shows that the attachment of backing plates 14 can also be accomplished with screws 22. For this purpose, screw 22 passes with radial clearance through a bore 23 in electrode 4 and rests with its head 24 by way of an elastic seal 25 against the base of an expanded section 26 of bore 23. In backing plate 14, a threaded bore 27 is provided, into which screw 22 is screwed, so that it is able to hold backing plate 14 against electrode 4. The clearance in bore 23, however, makes it possible for backing plate 14 to be shifted around slightly on electrode 4, so that different degrees of thermal expansion can be compensated.

What is claimed is:

1. Sputter cathode assembly comprising, an electrode having a vertical front surface with upward pointing slot means therein, target means, metallic backing plate means permanently bonded to said target means, said backing plate means having substantially the same coefficient of thermal expansion as said target means, said backing plate means having downward pointing hanger lug means received in said upward pointing slot means so that said backing plate means is held in contact with the front surface of the electrode by virtue of the weight of the target means and backing plate means.

2. Sputter cathode assembly as in claim 1 wherein said target means comprises a plurality of target segments, said backing plate means comprising a plurality of backing plates, each target segment being permanently bonded to a respective backing plate, said hangar lug means comprising at least one downward pointing hanger lug on each said backing plate.

3. Sputter cathode assembly as in claim 1 wherein said target means is indium-tin oxide and said backing plate means is molybdenum.

\* \* \* \* \*